US012808903B2

(12) United States Patent
Leow

(10) Patent No.: US 12,808,903 B2
(45) Date of Patent: Nov. 24, 2026

(54) COMMON-MODE (CM) INPUT SAMPLING CHOPPER SCHEME TO ENHANCE CM REJECTION PERFORMANCE UNDER DIFFERENTIAL PARASITIC MISMATCHES

(71) Applicant: QUALCOMM Incorporated, San Diego, CA (US)

(72) Inventor: Yoon Hwee Leow, Singapore (SG)

(73) Assignee: QUALCOMM Incorporated, San Diego, CA (US)

( * ) Notice: Subject to any disclaimer, the term of this patent is extended or adjusted under 35 U.S.C. 154(b) by 147 days.

(21) Appl. No.: 18/892,041

(22) Filed: Sep. 20, 2024

(65) Prior Publication Data

US 2026/0086122 A1 Mar. 26, 2026

(51) Int. Cl.

*G01R 15/16* (2006.01)
*G01R 19/10* (2006.01)
*H03K 17/687* (2006.01)

(52) U.S. Cl.

CPC ............. *G01R 15/16* (2013.01); *G01R 19/10* (2013.01); *H03K 17/6872* (2013.01)

(58) Field of Classification Search

None
See application file for complete search history.

(56) References Cited

U.S. PATENT DOCUMENTS

2014/0176239 A1* 6/2014 Duggal ............... H03F 3/45183 330/260
2020/0350679 A1* 11/2020 Yu ............................ H01P 1/18
2021/0058046 A1 2/2021 Zanbaghi et al.

FOREIGN PATENT DOCUMENTS

JP 2011166278 A * 8/2011
WO 03084073 A1 10/2003
WO 2018215141 A1 11/2018

OTHER PUBLICATIONS

Guo C., et al., "A Survey of Energy Consumption Measurement in Embedded Systems", IEEE Access, IEEE, USA, vol. 9, Apr. 19, 2021, pp. 60516-60530, XP011851255, abstract; figure 5.
International Search Report and Written Opinion—PCT/US2025/046207—ISA/EPO—Nov. 27, 2025.

* cited by examiner

*Primary Examiner* — Rodney E Fuller
(74) *Attorney, Agent, or Firm* — Patterson + Sheridan, L.L.P.

(57) ABSTRACT

A voltage sensing circuit is described that generally includes: a first capacitive element; a second capacitive element; a first transistor pair coupled between a first terminal and a second terminal of the first capacitive element and a first input and a second input of the voltage sensing circuit, respectively; and a second transistor pair coupled between a first terminal and a second terminal of the second capacitive element and the first input and the second input of the voltage sensing circuit, respectively. The voltage sensing circuit also includes: a third transistor pair coupled between a reference voltage node and the first terminal and the second terminal of the first capacitive element, respectively; and a fourth transistor pair coupled between the reference voltage node and the first terminal and the second terminal of the second capacitive element, respectively.

20 Claims, 6 Drawing Sheets

COMMON-MODE (CM) INPUT SAMPLING CHOPPER SCHEME TO ENHANCE CM REJECTION PERFORMANCE UNDER DIFFERENTIAL PARASITIC MISMATCHES

Certain aspects of the present disclosure generally relate to electronic circuits and, more particularly, to circuits and techniques for voltage sensing.

BACKGROUND

Parasitic elements refer to unintended and often undesirable effects of impedances that may be inherent in circuit components and layouts. The parasitic elements may include parasitic capacitance, inductance, and resistance, which can influence circuit performance. For example, parasitic elements may result in degraded signal integrity, increased noise, and an altered frequency response. Considering the effects of parasitic elements and taking measures to mitigate such effects is often important in designing effective circuits.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide the advantages described herein.

Certain aspects of the present disclosure are directed towards a voltage sensing circuit. The voltage sensing circuit generally includes: a first capacitive element; a second capacitive element; a first transistor pair coupled between a first terminal and a second terminal of the first capacitive element and a first input and a second input of the voltage sensing circuit, respectively; a second transistor pair coupled between a first terminal and a second terminal of the second capacitive element and the first input and the second input of the voltage sensing circuit, respectively; a third transistor pair coupled between a reference voltage node and the first terminal and the second terminal of the first capacitive element, respectively; and a fourth transistor pair coupled between the reference voltage node and the first terminal and the second terminal of the second capacitive element, respectively.

Certain aspects of the present disclosure are directed towards a method for voltage sensing. The method generally includes: electrically coupling a first capacitive element and a second capacitive element to differential inputs to charge the first capacitive element and the second capacitive element to a differential voltage during a first sampling phase; electrically coupling first terminals of the first capacitive element and the second capacitive element to a reference voltage node and second terminals of the first capacitive element and the second capacitive element to an amplifier circuit during a first common-mode chopped phase after the first sampling phase; electrically coupling the first capacitive element and the second capacitive element to the differential inputs to charge the first capacitive element and the second capacitive element to the differential voltage during a second sampling phase; and electrically coupling the second terminals of the first capacitive element and the second capacitive element to the reference voltage node and the first terminals of the first capacitive element and the second capacitive element to the amplifier circuit during a second common-mode chopped phase after the second sampling phase.

Certain aspects of the present disclosure are directed towards a wireless device. The wireless device generally includes a battery, a current-sensing resistive element coupled between the battery and a load, and a voltage sensing circuit including a first input coupled to a first terminal of the current-sensing resistive element and a second input coupled to a second terminal of the current-sensing resistive element, the voltage sensing circuit comprising: a first capacitive element; a second capacitive element; a first transistor pair coupled between a first terminal and a second terminal of the first capacitive element and the first input and the second input of the voltage sensing circuit, respectively; a second transistor pair coupled between a first terminal and a second terminal of the second capacitive element and the first input and the second input of the voltage sensing circuit, respectively; a third transistor pair coupled between a reference voltage node and the first terminal and the second terminal of the first capacitive element, respectively; and a fourth transistor pair coupled between the reference voltage node and the first terminal and the second terminal of the second capacitive element, respectively.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure are directed toward circuits and techniques for differential voltage sensing in the presence of a relatively high common-mode (CM) input voltage, compared to a differential input voltage. The voltage sensing circuit may include capacitive elements for sampling the differential input voltage. The differential input voltage may be sampled via the capacitive elements without sensing the CM input voltage. After sampling, the capacitive elements may be coupled (e.g., electrically coupled) between a reference voltage (Vref) node and inputs of an integrator, effectively providing an adjusted (e.g., chopped) CM voltage at the inputs of the integrator and also adjusting (e.g., doubling or even decreasing to accommodate a smaller voltage headroom of receiving circuitries) the differential voltage at the inputs of the integrator, as described in more detail herein. In this manner, the differential input voltage may be sensed more accurately in the presence of a relatively high CM voltage (e.g., a high CM voltage with respect to the differential voltage). In some aspects, the coupling between terminals of the capacitive elements and inputs of the integrator may be switched to cancel an error voltage caused by parasitic capacitances, as described in more detail herein. As used herein, "cancelling an error voltage" may refer to completely canceling or reducing (e.g., at least partially cancelling) the error voltage.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

An Example Device

Figure 1:
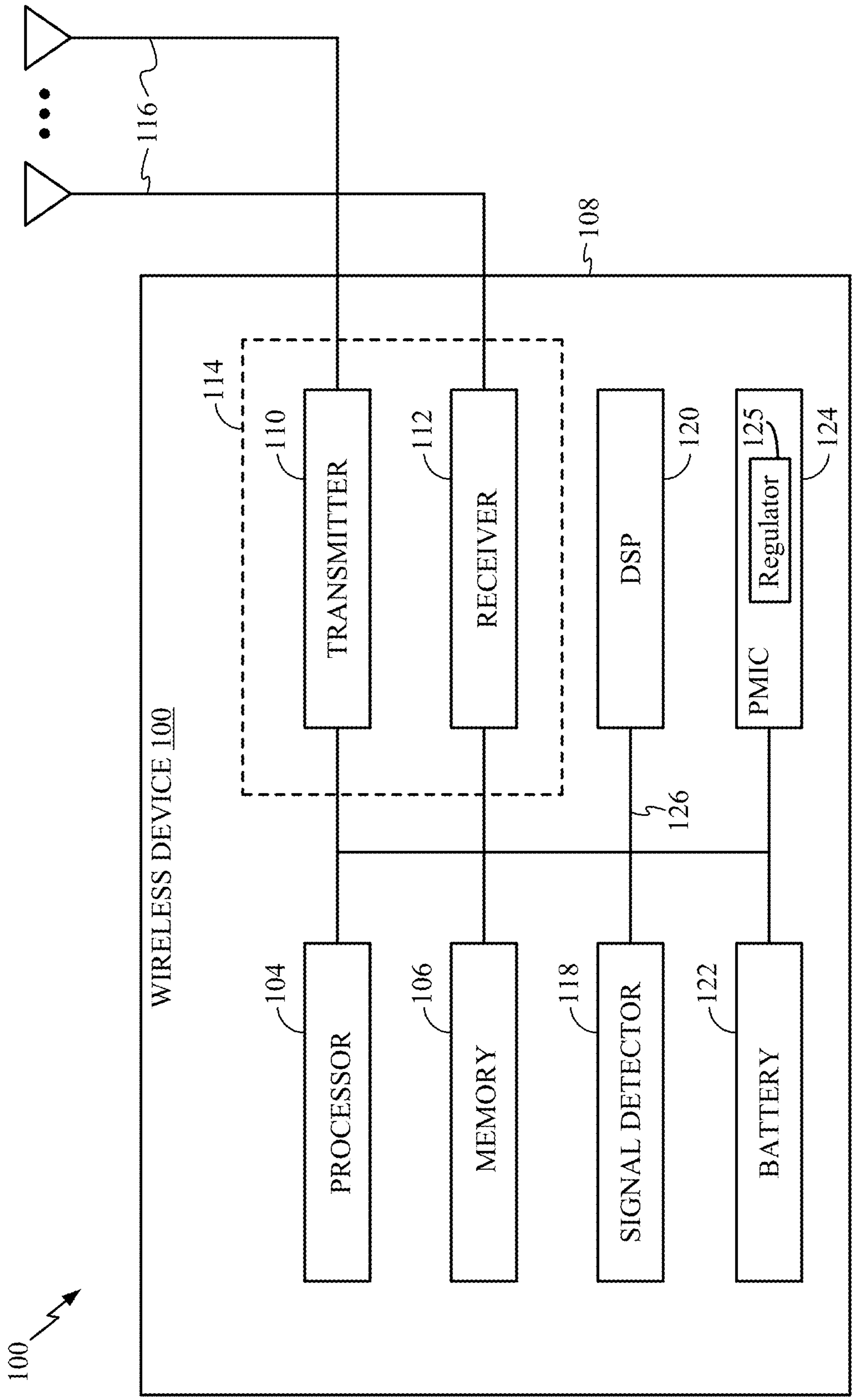
FIG. 1 is a block diagram of an example device including a voltage regulator, in which aspects of the present disclosure may be practiced.

FIG. 1 illustrates a device 100. The device 100 may be a battery-operated and/or wireless device such as a cellular phone, a personal digital assistant (PDA), a handheld device, a wireless modem, a laptop computer, a tablet, a personal computer, a head-mounted or other wearable device, an augmented or virtual reality device, etc. The device 100 is an example of a device that may be configured to implement the various systems and methods described herein.

The device 100 may include at least one processor 104 which controls operation of the device 100. The processor 104 may also be referred to as a central processing unit (CPU). Memory 106, which may include both read-only memory (ROM) and random access memory (RAM), provides instructions and data to the processor 104. A portion of the memory 106 may also include non-volatile random access memory (NVRAM). The processor 104 typically performs logical and arithmetic operations based on program instructions stored within the memory 106. The instructions in the memory 106 may be executable to implement the methods described herein.

The device 100 may also include a housing 108 that may include a transmitter 110 and a receiver 112 to allow transmission and reception of data between the device 100 and a remote location. The transmitter 110 and receiver 112 may be combined into a transceiver 114. A plurality of antennas 116 may be electrically coupled to the transceiver 114. One or more of the antennas 116 may be disposed adjacent to, attached to, or integrated in the housing 108. The device 100 may also include (not shown) multiple transmitters, multiple receivers, and multiple transceivers.

The device 100 may also include a signal detector 118 that may be used in an effort to detect and quantify the level of signals received by the transceiver 114. The signal detector 118 may detect such signals as total energy, energy per subcarrier per symbol, power spectral density and other signals. The device 100 may also include a digital signal processor (DSP) 120 for use in processing signals.

The device 100 may further include a battery 122 used to power the various components of the device 100. The device 100 may also include a power management integrated circuit (power management IC or PMIC) 124 for managing the power provided from the battery to the various components of the device 100. The PMIC 124 may perform a variety of functions for the device such as DC-to-DC conversion (e.g., with a voltage regulator 125, such as a switched-mode power supply (SMPS)), battery charging, power-source selection, voltage scaling, power sequencing, etc. In certain aspects, the PMIC 124 may be implemented with CM voltage rejection, as described in more detail herein.

The various components of the device 100 may be coupled together by a bus system 126, which may include a power bus, a control signal bus, and a status signal bus in addition to a data bus.

Example Voltage Sensing Techniques

Some aspects of the present disclosure are directed toward a voltage sensing circuit that may be used to sense a differential voltage (Vdiff) in the presence of a high CM voltage (VCM) relative to Vdiff. The techniques described herein may be applied to perform voltage sensing in any suitable application, such as current sensing for a battery or other power source. The voltage across a resistive element may be sensed to determine a current draw from the battery or other power source. The CM voltage across the resistive element may be high relative to the differential voltage across the resistive element. For example, with two battery cells in series, the CM voltage may be as high 12 V, and with three battery cells in series, the CM voltage may be as high 20 V. The sensed current may be used to perform battery current-limiting operations. It may not be possible to scale existing voltage sensing circuits because components (e.g., transistors) of existing solutions may be unable to withstand the high CM voltage. Moreover, when supporting battery sensing under different modes, there may be conditions whereby the differential input voltage deviates by a large voltage level, even when the differential voltage is not being used. Such conditions pose challenges such as the inability to short inputs for offset measurement conversions, and the inability to chop the differential inputs for averaging (e.g., using a chopper in the differential signal path). As a result, the voltage sensing circuit may become susceptible to differential parasitic capacitances on input sense channels.

Figure 2:
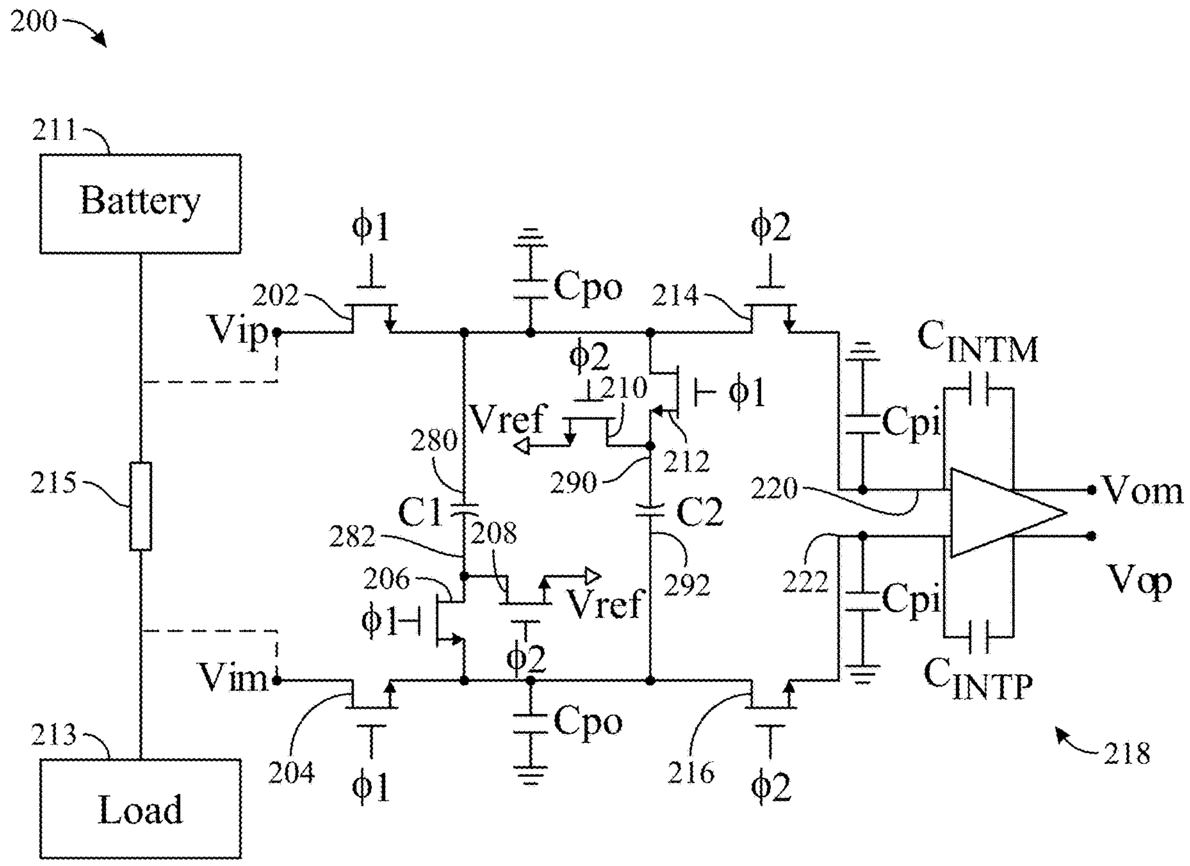
FIG. 2 illustrates an example voltage sensing circuit, in accordance with certain aspects of the present disclosure.

FIG. 2 illustrates a voltage sensing circuit 200. The circuit 200 may include a positive differential input voltage (Vip) node and a negative differential input voltage (Vim) node. In some cases, the Vip and Vim nodes may be coupled to the respective terminals of a current-sensing resistive element 215 coupled between a battery 211 and a load 213. In some cases, current sensing may be performed using a sensing element that may be a current conducting transistor or resistive element. The sensed differential input voltage may be used to determine an amount of current draw from the battery.

As shown, the circuit 200 may include (i) a transistor 202 coupled between the Vip node and a terminal 280 of a first capacitive element C1 and (ii) a transistor 204 coupled between the Vim node and a terminal 292 of a second capacitive element C2. A transistor 206 may be coupled between a terminal 282 of C1 and the transistor 204, and a transistor 212 may be coupled between a terminal 290 of C2 and transistor 202.

A transistor 208 may be coupled between the terminal 282 of C1 and a reference voltage (Vref) node, and a transistor 210 may be coupled between the terminal 290 of C2 and the Vref node. The Vref node may also be referred to as a "CM input voltage ($V_{ICM}$) node" because this node may be used to set the CM input voltage of an integrator 218, as described in more detail herein. A transistor 214 may be coupled between the terminal 280 of C1 and a first input 220 of the integrator 218, and a transistor 216 may be coupled between the terminal 292 of C2 and a second input 222 of the integrator 218.

During a first phase (ϕ1, also referred to herein as a "sampling phase"), the transistors 202, 204, 206, 212 are turned on, while transistors 208, 210, 214, 216 are turned off, so that capacitive elements C1 and C2 are coupled in parallel with the differential input (e.g., Vip and Vim) of the circuit 200. Thus, capacitive element C1 may be charged to the differential input voltage (Vdiff) of circuit 200, which may be equal to Vip minus Vim. Capacitive element C2 may also be charged to Vdiff.

During a second phase (ϕ2, also referred to as a "CM chopped phase"), the transistors 202, 204, 206, 212 are turned off, and transistors 208, 210, 214, 216 are turned on. Thus, capacitive element C1 is effectively coupled between the Vref node and the first input 220 of integrator 218, and the capacitive element C2 is effectively coupled between the Vref node and the second input 222 of integrator 218. Vref may be set to a voltage that is less than the CM input voltage of circuit 200 to perform a CM voltage shift and set the CM input voltage of integrator 218. For example, Vref may be set to 0.9 V so that the CM input voltage of integrator 218 is at 0.9 V. Moreover, Vref plus Vdiff may be provided to the second input 222 of integrator 218, and Vref minus Vdiff may be provided to the first input 220 of integrator 218, effectively doubling Vdiff for integration and allowing for a more accurate sensing of Vdiff in the presence of a high CM voltage at the input of circuit 200. As shown, the integrator 218 includes a negative integration capacitive element (labeled "$C_{INTM}$") and a positive integration capacitive element (labeled "$C_{INTP}$"), which may be coupled between respective inputs 220, 222 and respective outputs (labeled "Vom" and "Vop") of the integrator 218, as shown.

The circuit 200 may include parasitic capacitances, represented by capacitive elements labeled "Cpo" coupled to terminal 280 of C1 and terminal 292 of C2, respectively, and capacitive elements labeled "Cpi" coupled to respective inputs 220, 222 of integrator 218. During ϕ1, capacitive elements Cpo may be charged to the CM input voltage of circuit 200. During ϕ2, capacitive elements Cpo may be coupled to and result in charge sharing with C1, C2, respectively, causing an error voltage (Verr) as described in more detail herein.

Figure 3:
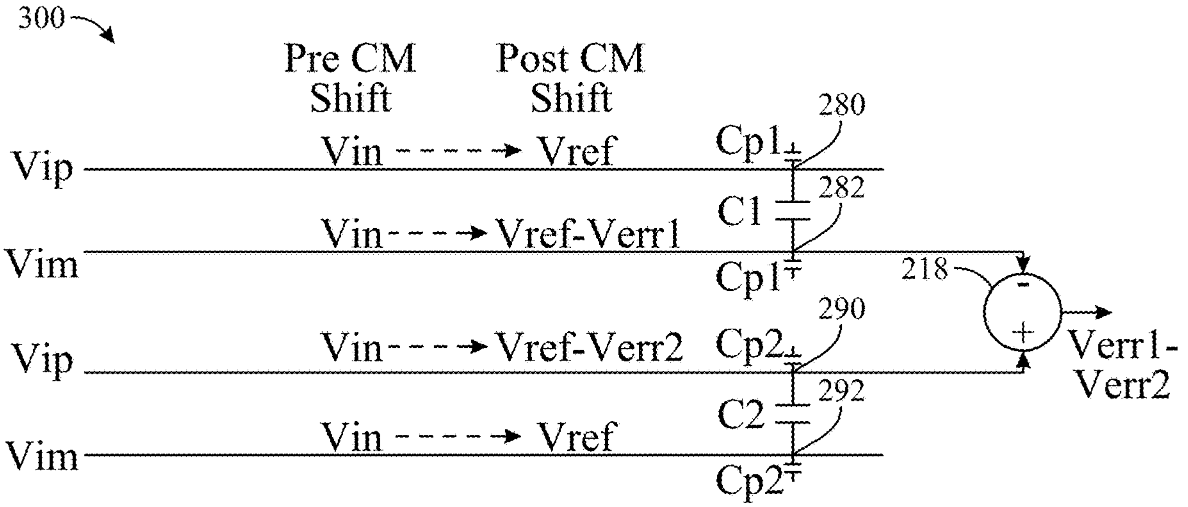
FIG. 3 is a diagram illustrating error voltages generated due to parasitic capacitances.

FIG. 3 is a diagram 300 illustrating error voltages generated due to parasitic capacitances of circuit 200. To facilitate understanding, Vdiff at the input of circuit 200 may be assumed to be zero. Thus, the input voltage labeled "Vin" may be equal to Vip and Vim, which may also be equal to the CM input voltage of circuit 200. The diagram 300 represents the circuit 200 during ϕ2 after a sampling phase has occurred. Parasitic capacitive elements Cp2 may be coupled to respective terminals 290, 292 of C2, and parasitic capacitive elements Cp1 may be coupled to respective terminals 280, 282 of C1. During ϕ2, the terminal 280 of C1 may be coupled to the Vref node, and the terminal 282 of C1 may be coupled to a negative input of integrator 218. A voltage transition (e.g., also referred to herein as a "CM voltage shift") may occur during ϕ2 where the terminal 280 of C1 transitions from Vin to Vref and the terminal 282 of C1 transitions from Vin to Vref minus a first error voltage (Verr1) due to charge sharing between C1 and Cp1 coupled to the terminal 282 of C1. Similarly, a voltage transition may occur during ϕ2 where the terminal 292 of C2 transitions from Vin to Vref and the terminal 290 of C2 transitions from Vin to Vref minus a second error voltage (Verr2) due to charge sharing between C2 and Cp2 coupled to the terminal 290 of C2. Since Cp1 may not likely equal Cp2, Verr1 may be different than Verr2. Thus, output voltage of the integrator 218 may have an error voltage equal to Verr1 minus Verr2, as shown.

Figure 4:
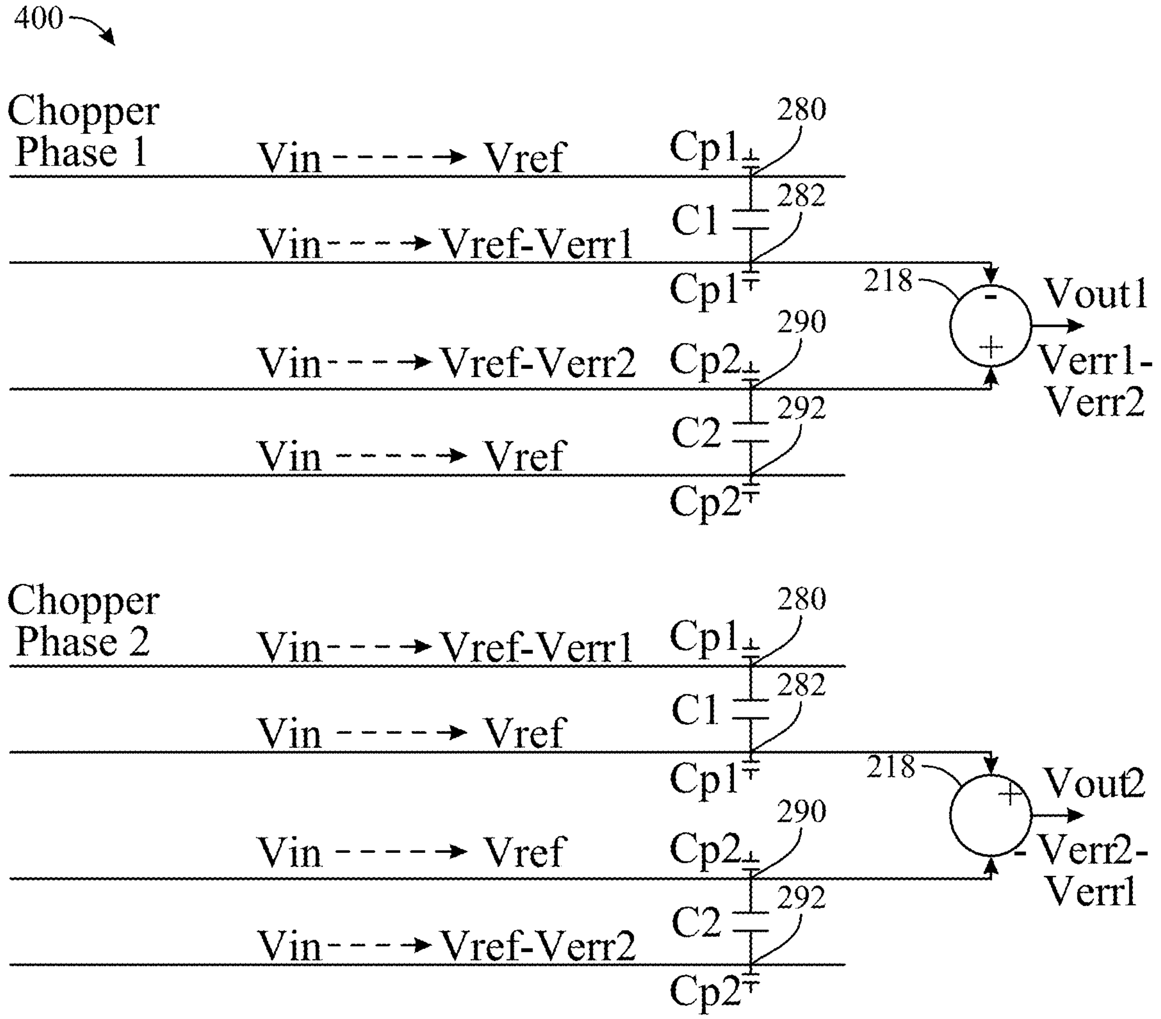
FIG. 4 is a diagram illustrating techniques for error voltage cancellation, in accordance with certain aspects of the present disclosure.

FIG. 4 is a diagram 400 illustrating techniques for error voltage cancellation, in accordance with certain aspects of the present disclosure. A sampling phase (e.g., corresponding to ϕ1 described with respect to FIG. 2) may occur, followed by a CM chopper phase 1. As shown, during the CM chopper phase 1, the terminal 280 of C1 may be coupled to the Vref node, and the terminal 282 of C1 may be coupled to the negative input of integrator 218. Moreover, the terminal 292 of C2 may be coupled to the Vref node, and the terminal 290 of C2 may be coupled to the positive input of integrator 218. Thus, the voltage (Vout1) at the output of integrator 218 may have an error voltage equal to Verr1 minus Verr2, as described with respect to FIG. 3.

Following the CM chopper phase 1, another sampling phase may occur following by CM chopper phase 2. CM chopper phase 1 and CM chopper phase 2 may be performed consecutively if extra capacitive elements are used. As shown, during CM chopper phase 2, the terminal 282 of C1 may be coupled to the Vref node, and the terminal 280 of C1 may be coupled to the positive input of integrator 218, transitioning the terminal 280 of C1 from Vin to Vref and the terminal 282 of C1 from Vin to Vref minus Verr1. Moreover, the terminal 290 of C2 may be coupled to the Vref node, and the terminal 292 of C2 may be coupled to the negative input of integrator 218, transitioning the terminal 290 of C2 from Vin to Vref and the terminal of 292 of C2 from Vin to Vref minus Verr2. Thus, the voltage (Vout2) at the output of integrator 218 may have an error voltage equal to Verr2 minus Verr1. Across multiple sampling and chopper phases, the output signal of integrator 218 may average to provide an average voltage of ½ (Vout1−Vout2). With Vout1 being equal to Verr1 minus Verr2 and Vout2 being equal to Verr2 minus Verr1, the error voltages are cancelled across CM chopper phase 1 and CM chopper phase 2.

Figure 5:
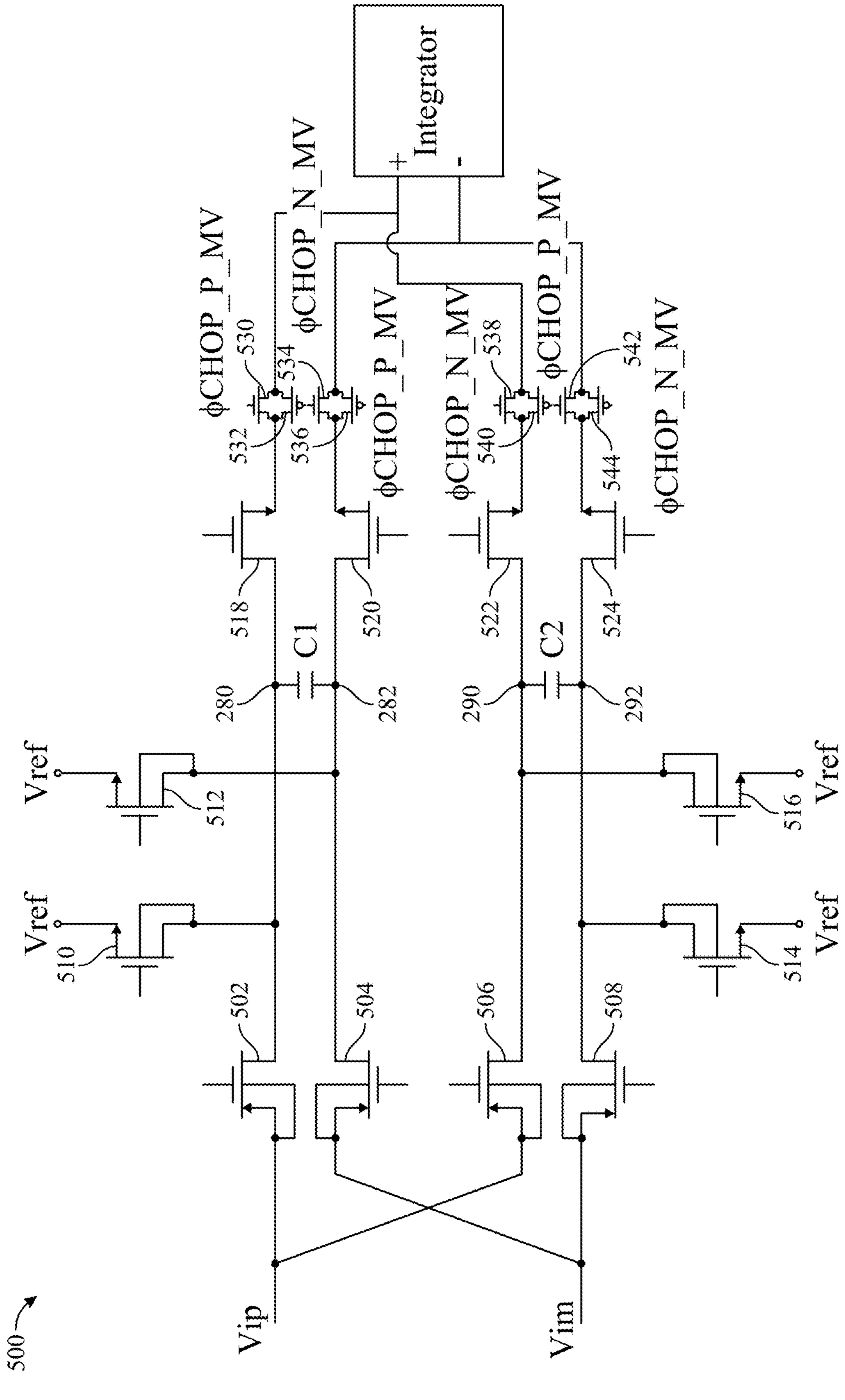
FIG. 5 is an example voltage sensing circuit with error voltage cancellation, in accordance with certain aspects of the present disclosure.

FIG. 5 is a voltage sensing circuit 500 for voltage sensing with error voltage cancellation, in accordance with certain aspects of the present disclosure. The circuit 500 may include (i) a transistor 502 coupled between the Vip node and the terminal 280 of C1 and (ii) a transistor 504 coupled between the Vim node and the terminal 282 of C1. The circuit 500 may also include (i) a transistor 506 coupled between the Vip node and the terminal 290 of C2 and (ii) a transistor 508 coupled between the Vim node and the terminal 292 of C2. In some aspects, a transistor 510 may be coupled between the terminal 280 of C1 and the Vref node, a transistor 512 may be coupled between the terminal 282 of C1 and the Vref node, a transistor 514 may be coupled between the terminal 292 of C2 and the Vref node, and a transistor 516 may be coupled between the terminal 290 of C2 and the Vref node.

A transistor 518 may be coupled between the terminal 280 and a transmission gate (T-gate) including an n-type metal-oxide-semiconductor (NMOS) transistor 530 and a p-type metal-oxide-semiconductor (PMOS) transistor 532 where sources of transistors 530, 532 are coupled together and drains of transistors 530, 532 are coupled together. A transistor 520 may be coupled between the terminal 282 of C1 and a T-gate including an NMOS transistor 534 and a PMOS transistor 536. A transistor 522 may be coupled between the terminal 290 of C2 and a T-gate including an NMOS transistor 538 and a PMOS transistor 540. A transistor 524 may be coupled between the terminal 292 of C2 and a T-gate including an NMOS transistor 542 and a PMOS transistor 544.

During a sampling phase, transistors 502, 504, 506, 508 are turned on, and transistors 518, 520, 522, 524 are turned off, coupling C1 and C2 in parallel with the differential input of the circuit 500 and sampling Vdiff on C1 and C2. Following the sampling phase, the CM chopper phase 1 may begin during which transistors 502, 504, 506, 508 are turned off and transistors 510, 514 are turned on. Transistors 518, 520, 522, 524 are turned on, transmission gate transistors 534, 536, 538, 540 are turned on, and transmission gate transistors 530, 532, 542, 544 are turned off, electrically coupling C1 between the Vref node and the negative input of integrator 218 and C2 between the Vref node and the positive input of integrator 218, resulting in the CM voltage at the input of the integrator 218 being set to Vref (e.g., 0.9 V).

After the CM chopper phase 1, another sampling phase occurs where transistors 502, 504, 506, 508 are turned on, transistors 518, 520, 522, 524 are turned off, and Vdiff is again sampled on C1 and C2. After the other sampling phase, the CM chopper phase 2 begins during which transistors 502, 504, 506, 508 are turned off and transistors 512, 516 are turned on. Transistors 518, 520, 522, 524 are turned on, transmission gate transistors 530, 532, 542, 544 are turned on, and transmission gate transistors 534, 536, 538, 540 are turned off, electrically coupling C1 between the Vref node and the positive input of integrator 218 and C2 between the Vref node and the negative input of integrator 218, as shown.

The transmission gate transistors are used to maintain the correct polarity at the output of the circuit 500 (e.g., direct the current from C1 and C2 to the negative and positive inputs of integrator 218). Transistors 518, 520, 522, 524 may both switch (e.g., turn on) during chopper phase 1 and chopper phase 2 so that C1 and C2 see the same coupling from the switching of transistors 518, 520, 522, 524 (e.g., the impact on C1 and C2 charges from switching transistors 518, 520, 522, 524 may be evened out). Thus, the transmission gates may be used to isolate the integrator 218 inputs during the chopper phases and steer the charge from C1 and C2 to the inputs of the integrator 218, as described.

The voltage sensing circuit described herein mitigates a source of offset error due to parasitic capacitance mismatches. A low-level signal may be sampled by capacitive element in a differential manner. The capacitive elements may sample a differential input voltage without sampling the CM input voltage. The CM voltage may be chopped (e.g., a lower CM voltage may be generated at the input of integrator 218) and twice the signal charge representing the differential voltage may be provided to the integrator during an integration phase.

Figure 6:
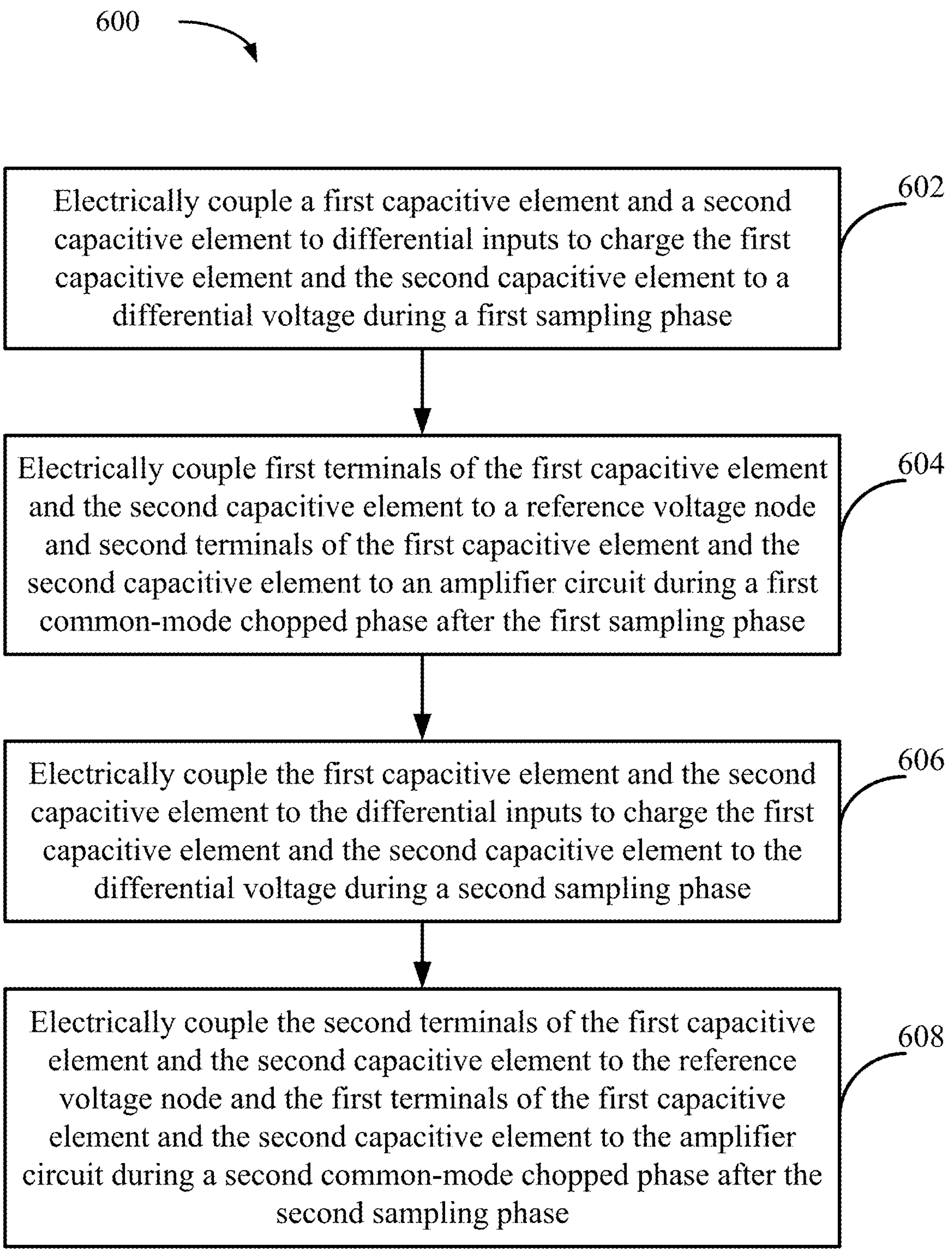
FIG. 6 is a flow diagram illustrating example operations for voltage sensing, in accordance with certain aspects of the present disclosure.

FIG. 6 is a flow diagram illustrating example operations 600 for voltage sensing, in accordance with certain aspects of the present disclosure. The operations 600 may be performed by a voltage sensing circuit, such as the voltage sensing circuit 500 of FIG. 5.

At block 602, the voltage sensing circuit may electrically couple a first capacitive element (e.g., C1 of FIG. 5) and a second capacitive element (e.g., C2) to differential inputs (e.g., Vip and Vim) to charge the first capacitive element and the second capacitive element to a differential voltage during a first sampling phase.

At block 604, the voltage sensing circuit electrically couples first terminals (e.g., terminals 280, 292) of the first capacitive element and the second capacitive element to a reference voltage node (e.g., Vref node) and second terminals (e.g., terminals 282, 290) of the first capacitive element and the second capacitive element to an amplifier circuit during a first common-mode chopped phase after the first sampling phase.

At block 606, the voltage sensing circuit electrically couples the first capacitive element and the second capacitive element to the differential inputs to charge the first capacitive element and the second capacitive element to the differential voltage during a second sampling phase. The second sampling phase may occur after the first common-mode chopped phase.

At block 608, the voltage sensing circuit electrically couples the second terminals of the first capacitive element and the second capacitive element to the reference voltage node and the first terminals of the first capacitive element and the second capacitive element to the amplifier circuit during a second common-mode chopped phase after the second sampling phase.

In some aspects, the first terminals of the first capacitive element and the second capacitive element may be coupled to a first input and a second input of the amplifier circuit, respectively, during the second common-mode chopped phase. The second terminals of the first capacitive element and the second capacitive element may be coupled to the second input and the first input of the amplifier circuit, respectively, during the first common-mode chopped phase.

In some aspects, the amplifier circuit comprises an integrator (e.g., integrator 218). The voltage sensing circuit may generate, via the integrator, an integrated voltage based on (i) a first differential integrator input voltage at the first input and the second input during the first common-mode chopped phase and (ii) a second differential integrator input voltage at the first input and the second input during the second common-mode chopped phase. The integrated voltage may represent an average of the first differential integrator input voltage and the second differential integrator input voltage.

The various operations of methods described above may be performed by any suitable means capable of performing the corresponding functions. The means may include various hardware and/or software component(s) and/or module (s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

EXAMPLE ASPECTS

In addition to the various aspects described above, specific combinations of aspects are within the scope of the disclosure, some of which are detailed below:

Aspect 1: A voltage sensing circuit comprising: a first capacitive element; a second capacitive element; a first transistor pair coupled between a first terminal and a second terminal of the first capacitive element and a first input and a second input of the voltage sensing circuit, respectively; a second transistor pair coupled between a first terminal and a second terminal of the second capacitive element and the first input and the second input of the voltage sensing circuit, respectively; a third transistor pair coupled between a reference voltage node and the first terminal and the second terminal of the first capacitive element, respectively; and a fourth transistor pair coupled between the reference voltage node and the first terminal and the second terminal of the second capacitive element, respectively.

Aspect 2: The voltage sensing circuit of Aspect 1, further comprising: an amplifier circuit; a fifth transistor pair coupled between the first terminal and the second terminal of the first capacitive element and the first input and the second input of the amplifier circuit, respectively; and a sixth transistor pair coupled between the first terminal and the second terminal of the second capacitive element and the first input and the second input of the amplifier circuit, respectively.

Aspect 3: The voltage sensing circuit of Aspect 2, wherein each transistor of the fifth transistor pair and the sixth transistor pair is part of a transmission gate.

Aspect 4: The voltage sensing circuit of Aspect 2 or 3, wherein the amplifier circuit comprises an integrator.

Aspect 5: The voltage sensing circuit according to any of Aspects 2-4, further comprising: a seventh transistor pair coupled between the first terminal and the second terminal of the first capacitive element and the fifth transistor pair, respectively; and an eighth transistor pair coupled between the first terminal and the second terminal of the second capacitive element and the respective sixth transistor pair, respectively.

Aspect 6: The voltage sensing circuit according to any of Aspects 1-5, wherein: the first transistor pair and the second transistor pair are configured to be turned on during a first sampling phase; and one of the third transistor pair and one of the fourth transistor pair are configured to be turned on during a first common-mode chopped phase after the first sampling phase.

Aspect 7: The voltage sensing circuit of Aspect 6, wherein: the first transistor pair and the second transistor pair are configured to be turned on during a second sampling phase after the first common-mode chopped phase; and another one of the third transistor pair and another one of the fourth transistor pair are configured to be turned on during a second common-mode chopped phase after the second sampling phase.

Aspect 8: The voltage sensing circuit of Aspect 7, further comprising: an amplifier circuit; a fifth transistor pair coupled between the first terminal and the second terminal of the first capacitive element and the first input and the second input of the amplifier circuit, respectively, wherein one of the fifth transistor pair is configured to be turned on during the first common-mode chopped phase and another one of the fifth transistor pair is configured to be turned on during the second common-mode chopped phase; and a sixth transistor pair coupled between the first terminal and the second terminal of the second capacitive element and the first input and the second input of the amplifier circuit, respectively, wherein one of the sixth transistor pair is configured to be turned on during the first common-mode chopped phase and another one of the sixth transistor pair is configured to be turned on during the second common-mode chopped phase.

Aspect 9: The voltage sensing circuit of Aspect 8, wherein: the first transistor pair and the second transistor pair are configured to electrically couple the first capacitive element and the second capacitive element to the first input and the second input of the voltage sensing circuit to charge the first capacitive element and the second capacitive element to a differential voltage during the first sampling phase; one of the third transistor pair is configured to couple the first terminal of the first capacitive element to the reference voltage node during the first common-mode chopped phase after the first sampling phase; one of the fourth transistor pair is configured to couple the second terminal of the second capacitive element to the reference voltage node during the first common-mode chopped phase; one of the fifth transistor pair is configured to couple the second terminal of the first capacitive element to the amplifier circuit during the first common-mode chopped phase; and one of the sixth transistor pair is configured to couple the first terminal of the second capacitive element to the amplifier circuit during the first common-mode chopped phase.

Aspect 10: The voltage sensing circuit of Aspect 9, wherein: the first transistor pair and the second transistor pair are configured to electrically couple the first capacitive element and the second capacitive element to the first input and the second input of the voltage sensing circuit to charge the first capacitive element and the second capacitive element to the differential voltage during the second sampling phase after the first common-mode chopped phase; another one of the third transistor pair is configured to couple the second terminal of the first capacitive element to the reference voltage node during the second common-mode chopped phase after the second sampling phase; another one of the fourth transistor pair is configured to couple the first terminal of the second capacitive element to the reference voltage node during the second common-mode chopped phase; another one of the fifth transistor pair is configured to couple the first terminal of the first capacitive element to the amplifier circuit during the second common-mode chopped phase; and another one of the sixth transistor pair is configured to couple the second terminal of the second capacitive element to the amplifier circuit during the second common-mode chopped phase.

Aspect 11: The voltage sensing circuit of Aspect 10, wherein the amplifier circuit comprises an integrator configured to generate an integrated voltage based on a first differential integrator input voltage at the first input and the second input during the first common-mode chopped phase and a second differential integrator input voltage at the first input and the second input during the second common-mode chopped phase.

Aspect 12: The voltage sensing circuit of Aspect 11, wherein the integrated voltage represents an average of the first differential integrator input voltage and the second differential integrator input voltage.

Aspect 13: A method for voltage sensing, comprising: electrically coupling a first capacitive element and a second capacitive element to differential inputs to charge the first capacitive element and the second capacitive element to a differential voltage during a first sampling phase; electrically coupling first terminals of the first capacitive element and the second capacitive element to a reference voltage node and second terminals of the first capacitive element and the second capacitive element to an amplifier circuit during a first common-mode chopped phase after the first sampling phase; electrically coupling the first capacitive element and the second capacitive element to the differential inputs to charge the first capacitive element and the second capacitive element to the differential voltage during a second sampling phase after the first common-mode chopped phase; and electrically coupling the second terminals of the first capacitive element and the second capacitive element to the reference voltage node and the first terminals of the first capacitive element and the second capacitive element to the amplifier circuit during a second common-mode chopped phase after the second sampling phase.

Aspect 14: The method of Aspect 13, wherein: the first terminals of the first capacitive element and the second capacitive element are coupled to a first input and a second input of the amplifier circuit, respectively, during the second common-mode chopped phase; and the second terminals of the first capacitive element and the second capacitive element are coupled to the second input and the first input of the amplifier circuit, respectively, during the first common-mode chopped phase.

Aspect 15: The method of Aspect 14, wherein: the amplifier circuit comprises an integrator; and the method further comprises generating, via the integrator, an integrated voltage based on a first differential integrator input voltage at the first input and the second input during the first common-mode chopped phase and a second differential integrator input voltage at the first input and the second input during the second common-mode chopped phase.

Aspect 16: The method of Aspect 15, wherein the integrated voltage represents an average of the first differential integrator input voltage and the second differential integrator input voltage.

Aspect 17: A wireless device comprising: a battery; a current-sensing resistive element coupled between the battery and a load; and a voltage sensing circuit including a first input coupled to a first terminal of the current-sensing resistive element and a second input coupled to a second terminal of the current-sensing resistive element, the voltage sensing circuit comprising: a first capacitive element; a second capacitive element; a first transistor pair coupled between a first terminal and a second terminal of the first capacitive element and the first input and the second input of the voltage sensing circuit, respectively; a second transistor pair coupled between a first terminal and a second terminal of the second capacitive element and the first input and the second input of the voltage sensing circuit, respectively; a third transistor pair coupled between a reference voltage node and the first terminal and the second terminal of the first capacitive element, respectively; and a fourth transistor pair coupled between the reference voltage node and the first terminal and the second terminal of the second capacitive element, respectively.

Aspect 18: The wireless device of Aspect 17, wherein the voltage sensing circuit further comprises: an amplifier circuit; a fifth transistor pair coupled between the first terminal and the second terminal of the first capacitive element and the first input and the second input of the amplifier circuit, respectively; and a sixth transistor pair coupled between the first terminal and the second terminal of the second capacitive element and the first input and the second input of the amplifier circuit, respectively.

Aspect 19: The wireless device of Aspect 18, wherein each transistor of the fifth transistor pair and the sixth transistor pair is part of a transmission gate.

Aspect 20: The wireless device of Aspect 18 or 19, wherein the amplifier circuit comprises an integrator.

It is to be understood that the claims are not limited to the precise configuration and components illustrated above. Various modifications, changes, and variations may be made in the arrangement, operation, and details of the methods and apparatus described above without departing from the scope of the claims.

What is claimed is:

1. A voltage sensing circuit comprising:

a first capacitive element;

a second capacitive element;

a first transistor pair coupled between a first terminal and a second terminal of the first capacitive element and a first input and a second input of the voltage sensing circuit, respectively;

a second transistor pair coupled between a first terminal and a second terminal of the second capacitive element and the first input and the second input of the voltage sensing circuit, respectively;

a third transistor pair coupled between a reference voltage node and the first terminal and the second terminal of the first capacitive element, respectively; and a fourth transistor pair coupled between the reference voltage node and the first terminal and the second terminal of the second capacitive element, respectively.

2. The voltage sensing circuit of claim 1, further comprising:

an amplifier circuit;

a fifth transistor pair coupled between the first terminal and the second terminal of the first capacitive element and the first input and the second input of the amplifier circuit, respectively; and a sixth transistor pair coupled between the first terminal and the second terminal of the second capacitive element and the first input and the second input of the amplifier circuit, respectively.

3. The voltage sensing circuit of claim 2, wherein each transistor of the fifth transistor pair and the sixth transistor pair is part of a transmission gate.

4. The voltage sensing circuit of claim 2, wherein the amplifier circuit comprises an integrator.

5. The voltage sensing circuit of claim 2, further comprising:

a seventh transistor pair coupled between the first terminal and the second terminal of the first capacitive element and the fifth transistor pair, respectively; and an eighth transistor pair coupled between the first terminal and the second terminal of the second capacitive element and the respective sixth transistor pair, respectively.

6. The voltage sensing circuit of claim 1, wherein:

the first transistor pair and the second transistor pair are configured to be turned on during a first sampling phase; and one of the third transistor pair and one of the fourth transistor pair are configured to be turned on during a first common-mode chopped phase after the first sampling phase.

7. The voltage sensing circuit of claim 6, wherein:

the first transistor pair and the second transistor pair are configured to be turned on during a second sampling phase after the first common-mode chopped phase; and another one of the third transistor pair and another one of the fourth transistor pair are configured to be turned on during a second common-mode chopped phase after the second sampling phase.

8. The voltage sensing circuit of claim 7, further comprising:

an amplifier circuit;

a fifth transistor pair coupled between the first terminal and the second terminal of the first capacitive element and the first input and the second input of the amplifier circuit, respectively, wherein one of the fifth transistor pair is configured to be turned on during the first common-mode chopped phase and another one of the fifth transistor pair is configured to be turned on during the second common-mode chopped phase; and a sixth transistor pair coupled between the first terminal and the second terminal of the second capacitive element and the first input and the second input of the amplifier circuit, respectively, wherein one of the sixth transistor pair is configured to be turned on during the first common-mode chopped phase and another one of the sixth transistor pair is configured to be turned on during the second common-mode chopped phase.

9. The voltage sensing circuit of claim 8, wherein:

the first transistor pair and the second transistor pair are configured to electrically couple the first capacitive element and the second capacitive element to the first input and the second input of the voltage sensing circuit to charge the first capacitive element and the second capacitive element to a differential voltage during the first sampling phase;

one of the third transistor pair is configured to couple the first terminal of the first capacitive element to the reference voltage node during the first common-mode chopped phase after the first sampling phase;

one of the fourth transistor pair is configured to couple the second terminal of the second capacitive element to the reference voltage node during the first common-mode chopped phase;

one of the fifth transistor pair is configured to couple the second terminal of the first capacitive element to the amplifier circuit during the first common-mode chopped phase; and one of the sixth transistor pair is configured to couple the first terminal of the second capacitive element to the amplifier circuit during the first common-mode chopped phase.

10. The voltage sensing circuit of claim 9, wherein:

the first transistor pair and the second transistor pair are configured to electrically couple the first capacitive element and the second capacitive element to the first input and the second input of the voltage sensing circuit to charge the first capacitive element and the second capacitive element to the differential voltage during the second sampling phase after the first common-mode chopped phase;

another one of the third transistor pair is configured to couple the second terminal of the first capacitive element to the reference voltage node during the second common-mode chopped phase after the second sampling phase;

another one of the fourth transistor pair is configured to couple the first terminal of the second capacitive element to the reference voltage node during the second common-mode chopped phase;

another one of the fifth transistor pair is configured to couple the first terminal of the first capacitive element to the amplifier circuit during the second common-mode chopped phase; and another one of the sixth transistor pair is configured to couple the second terminal of the second capacitive element to the amplifier circuit during the second common-mode chopped phase.

11. The voltage sensing circuit of claim 10, wherein the amplifier circuit comprises an integrator configured to generate an integrated voltage based on a first differential integrator input voltage at the first input and the second input during the first common-mode chopped phase and a second differential integrator input voltage at the first input and the second input during the second common-mode chopped phase.

12. The voltage sensing circuit of claim 11, wherein the integrated voltage represents an average of the first differential integrator input voltage and the second differential integrator input voltage.

13. A method for voltage sensing, comprising:

electrically coupling a first capacitive element and a second capacitive element to differential inputs to charge the first capacitive element and the second capacitive element to a differential voltage during a first sampling phase;

electrically coupling first terminals of the first capacitive element and the second capacitive element to a reference voltage node and second terminals of the first capacitive element and the second capacitive element to an amplifier circuit during a first common-mode chopped phase after the first sampling phase;

electrically coupling the first capacitive element and the second capacitive element to the differential inputs to charge the first capacitive element and the second capacitive element to the differential voltage during a second sampling phase after the first common-mode chopped phase; and electrically coupling the second terminals of the first capacitive element and the second capacitive element to the reference voltage node and the first terminals of the first capacitive element and the second capacitive element to the amplifier circuit during a second common-mode chopped phase after the second sampling phase.

14. The method of claim 13, wherein:

the first terminals of the first capacitive element and the second capacitive element are coupled to a first input and a second input of the amplifier circuit, respectively, during the second common-mode chopped phase; and the second terminals of the first capacitive element and the second capacitive element are coupled to the second input and the first input of the amplifier circuit, respectively, during the first common-mode chopped phase.

15. The method of claim 14, wherein:

the amplifier circuit comprises an integrator; and the method further comprises generating, via the integrator, an integrated voltage based on a first differential integrator input voltage at the first input and the second input during the first common-mode chopped phase and a second differential integrator input voltage at the first input and the second input during the second common-mode chopped phase.

16. The method of claim 15, wherein the integrated voltage represents an average of the first differential integrator input voltage and the second differential integrator input voltage.

17. A wireless device comprising:

a battery;

a current-sensing resistive element coupled between the battery and a load; and a voltage sensing circuit including a first input coupled to a first terminal of the current-sensing resistive element and a second input coupled to a second terminal of the current-sensing resistive element, the voltage sensing circuit comprising:

a first capacitive element;

a second capacitive element;

a first transistor pair coupled between a first terminal and a second terminal of the first capacitive element and the first input and the second input of the voltage sensing circuit, respectively;

a second transistor pair coupled between a first terminal and a second terminal of the second capacitive element and the first input and the second input of the voltage sensing circuit, respectively;

a third transistor pair coupled between a reference voltage node and the first terminal and the second terminal of the first capacitive element, respectively; and a fourth transistor pair coupled between the reference voltage node and the first terminal and the second terminal of the second capacitive element, respectively.

18. The wireless device of claim 17, wherein the voltage sensing circuit further comprises:

an amplifier circuit;

a fifth transistor pair coupled between the first terminal and the second terminal of the first capacitive element and the first input and the second input of the amplifier circuit, respectively; and a sixth transistor pair coupled between the first terminal and the second terminal of the second capacitive element and the first input and the second input of the amplifier circuit, respectively.

19. The wireless device of claim 18, wherein each transistor of the fifth transistor pair and the sixth transistor pair is part of a transmission gate.

20. The wireless device of claim 18, wherein the amplifier circuit comprises an integrator.

* * * * *